(12) United States Patent
Zhao et al.

(10) Patent No.: US 10,600,380 B2
(45) Date of Patent: Mar. 24, 2020

(54) SCANNING DRIVER CIRCUIT AND LIQUID CRYSTAL DISPLAY PANEL

(71) Applicant: Wuhan China Star Optoelectronics Technology Co., Ltd., Wuhan (CN)

(72) Inventors: Mang Zhao, Wuhan (CN); Yafeng Li, Wuhan (CN)

(73) Assignee: Wuhan China Star Optoeelectronics Technology Co., Ltd., Wuhan (CN)

( * ) Notice: Subject to any disclaimer, the term of this patent is extended or adjusted under 35 U.S.C. 154(b) by 306 days.

(21) Appl. No.: 15/548,414

(22) PCT Filed: Apr. 18, 2017

(86) PCT No.: PCT/CN2017/080945
§ 371 (c)(1),
(2) Date: Aug. 3, 2017

(87) PCT Pub. No.: WO2018/176516
PCT Pub. Date: Oct. 4, 2018

(65) Prior Publication Data
US 2018/0336856 A1    Nov. 22, 2018

(30) Foreign Application Priority Data
Mar. 29, 2017    (CN) .......................... 2017 1 0198534

(51) Int. Cl.
*G09G 3/36*        (2006.01)
*H03K 19/094*      (2006.01)
(Continued)

(52) U.S. Cl.
CPC ....... *G09G 3/3674* (2013.01); *G02F 1/13306* (2013.01); *G11C 19/28* (2013.01);
(Continued)

(58) Field of Classification Search
CPC .. G09G 3/3266; G09G 3/3674; G09G 3/3677; G09G 2300/0408;
(Continued)

(56) References Cited

U.S. PATENT DOCUMENTS 7,196,699 B1 *   3/2007   Kubota ................ G09G 3/3677
                                                      345/100
9,418,613 B2     8/2016   Xiao
(Continued)

FOREIGN PATENT DOCUMENTS

CN    104464659    3/2015
CN    104537996    4/2015
(Continued)

*Primary Examiner* — Amr A Awad
*Assistant Examiner* — Aaron Midkiff

(57) ABSTRACT

A scanning driving circuit includes a scanning-level-signal-generation module and a scanning-signal-output-module. The scanning-level-signal-generation module is configured to input an (N−1)th stage scanning signal, an (N+1)th stage scanning signal, and a reset signal, generate a scanning level signal based on the (N−1)th stage scanning signal, the (N+1)th stage scanning signal, and the reset signal, and hold the scanning level signal. The scanning-signal-output-module, connected to the scanning-level-signal-generation module, is configured to input a clock signal, and configured to output a scanning signal based in the scanning level signal and the clock signal.

10 Claims, 2 Drawing Sheets

(51) Int. Cl.
*G02F 1/133* (2006.01)
*G11C 19/28* (2006.01)

(52) U.S. Cl.
CPC ............ *H03K 19/09425* (2013.01); *G09G 2310/0264* (2013.01); *G09G 2310/0286* (2013.01); *G09G 2310/0294* (2013.01)

(58) Field of Classification Search
CPC ... G09G 2310/0264; G09G 2310/0267; G09G 2310/0286; G09G 2310/0289; G09G 2310/0291; G09G 2310/0294; H03K 19/00–23; H03K 19/09425; G11C 19/00–38; G11C 19/28; G02F 1/13306
USPC .................. 345/98–100; 377/64–81
See application file for complete search history.

(56) References Cited

U.S. PATENT DOCUMENTS

| | | | |
|---|---|---|---|
| 9,721,513 B2 | 8/2017 | Hao | |
| 9,934,745 B2 | 4/2018 | Chen et al. | |
| 2004/0239655 A1* | 12/2004 | Tani | G09G 3/3648 345/204 |
| 2015/0356913 A1 | 12/2015 | Kim | |
| 2016/0300623 A1* | 10/2016 | Yang | G11C 19/28 |
| 2016/0351156 A1* | 12/2016 | Wu | G11C 19/28 |
| 2017/0200408 A1* | 7/2017 | Zhang | G09G 3/20 |

FOREIGN PATENT DOCUMENTS

| | | |
|---|---|---|
| CN | 105427821 | 3/2016 |
| CN | 105810165 | 7/2016 |

\* cited by examiner

SCANNING DRIVER CIRCUIT AND LIQUID CRYSTAL DISPLAY PANEL

RELATED APPLICATIONS

This application is a National Phase of PCT Patent Application No. PCT/CN2017/080945 having International filing date of Apr. 18, 2017, which claims the benefit of priority of Chinese Patent Application No. 201710198534.3 filed on Mar. 29, 2017. The contents of the above applications are all incorporated by reference as if fully set forth herein in their entirety.

FIELD AND BACKGROUND OF THE INVENTION

The present disclosure relates to the field of liquid crystal display, and more particularly, to a scanning driving circuit and a liquid crystal display panel with the scanning driving circuit.

The present disclosure relates to the gate driver on array (GOA) technique. The GOA technique is that a gate scanning driver signal circuit is produced on an array substrate using the thin-film transistor (TFT) liquid crystal display (LCD) array substrate manufacturing process to realize row-by-row scanning on gates.

Low temperature poly-silicon (LTPS) semiconductor TFTs gradually develop. Also, the LTPS semiconductor has a feature of extremely high carrier mobility. With these reasons, integrated circuit (IC) related to panels becomes one of the key focuses in the industry, which further attracts many people to commit themselves to studying system on panels (SOPs) for realization.

As FIG. 1 shows, the design of the GOA circuit in the related art adopts a driving method of interlace. Unilateral GOA circuit needs two CK signal lines, a STV routing, a reset routing, a VGH routing, a VGL routing, a U2D routing, and a D2U routing. The CMOS GOA circuit is defined by a signal input control module 100, a reset module 200, a latch module 300, a node signal processing module 400, and a buffer processing module 500. The signal input control module 100 is configured to control the input of signals of the GOA circuit, control a clock control inverter through a CK signal, and realize transmittance of signals on a previous stage Q node to further hold the Q node. The reset module 200 is configured to reset the node of the signal in the circuit. The latch module 300 is configured to hold the signal on the Q node. The node signal processing module 400 is configured to generate a gate driver signal through an NAND operation of the CK signal and the signal on the Q node. The buffer processing module 500 is configured to enhance the driving capacity of the gate signal.

Therefore, the scanning driving circuit in the related art uses a clock control inverter and an inverter for the design of the latch unit and adopts a clock signal to input the latch signal and control pull-down. However, the clock signal loads much in this design so the clock signal is hardly applied to a high-resolution panel.

In sum, the driver scanning circuit in the related art is somewhat defective and needs being improved.

SUMMARY OF THE INVENTION

A scanning driving circuit proposed by the present disclosure includes a latch circuit replacing a latch circuit formed by a clock control inverter in the related art. The application of the present disclosure solves the technical problem that it is hard to use a clock signal configured to input a latch signal and control pull-down of a latch signal in a high-resolution panel because the load of the clock signal in the related art is great.

According to the present disclosure, a scanning driving circuit includes a plurality of cascade-connected scanning driver units. An Nth scanning driver unit of the plurality of scanning driver units includes a scanning-level-signal-generation module, configured to input an (N−1)th stage scanning signal, an (N+1)th stage scanning signal, and a reset signal, generate a scanning level signal based on the (N−1)th stage scanning signal, the (N+1)th stage scanning signal, and the reset signal, and hold the scanning level signal; the reset signal further resetting the scanning driving circuit, and a scanning-signal-output-module, connected to the scanning-level-signal-generation module, configured to input a clock signal, and configured to output a scanning signal based in the scanning level signal and the clock signal. A constant low-level source is configured to supply a constant low-level signal. A constant high-level source is configured to supply a constant high-level signal.

Furthermore, the scanning-level-signal-generation module comprises a first switch, a second switch, a third switch, a fourth switch, a fifth switch, a sixth switch, and an NOR gate controller. A control terminal of the first switch and a control terminal of the sixth switch cooperatively are connected to the (N−1)th stage scanning signal. A control terminal of the second switch and a control terminal of the fourth switch cooperatively are connected to a reset signal. The first terminal of the first switch and the first terminal of the second switch cooperatively receive the constant high-level signal. A first terminal of the fifth switch and a first terminal of the sixth switch cooperatively receive the constant low-level signal. A first terminal of the third switch is connected to a second terminal of the first switch. A first terminal of the fourth switch is connected to a second terminal of the fifth switch and a second terminal of the sixth switch. A control terminal of the third switch and a control terminal of the fifth switch cooperatively are connected to an output terminal of the scanning-level-signal-generation module. The NOR gate controller comprises a first input terminal, a second input terminal, and an output terminal; the first input terminal of the NOR gate controller is connected to a second terminal of the second switch, a second terminal of the third switch, a second terminal of the fourth switch; the second input terminal of the NOR gate controller is connected to the (N+1)th stage scanning signal. The output terminal of the NOR gate controller is connected to the output terminal of the scanning-level-signal-generation module.

Furthermore, the first switch, the second switch, and the third switch are P-type thin-film transistors, while the fourth switch, the fifth switch, and the sixth switch are N-type thin-film transistors. The control terminals of the first switch, the second switch, the third switch, the fourth switch, the fifth switch, and the sixth switch are gates, the first terminals of the first switch, the second switch, the third switch, the fourth switch, the fifth switch, and the sixth switch are sources, and the second terminals of the first switch, the second switch, the third switch, the fourth switch, the fifth switch, and the sixth switch are drains.

Furthermore, the reset signal from the scanning-level-signal-generation module is a low level signal.

Furthermore, the scanning-level-signal-generation module comprises: a first switch, a second switch, a third switch, a fourth switch, a fifth switch, a sixth switch, and an NOR gate controller. The NOR gate controller comprises a first input terminal, a second input terminal, and an output terminal. The first input terminal of the NOR gate controller is connected to the (N−1)th stage scanning signal. The second input terminal of the NOR gate controller is connected to an output terminal of the scanning-level-signal-generation module. The output terminal of the NOR gate controller is connected to the control terminal of the third switch. The control terminal of the first switch is connected to a reset signal. A first terminal of the first switch is connected to a constant high-level signal. A second terminal of the first switch is connected to a first terminal of the second switch. The control terminal of the second switch is connected to the (N+1)th stage scanning signal. A second terminal of the second switch is connected to a first terminal of the third switch. A first terminal of the fourth switch, a first terminal of the fifth switch, and a first terminal of the sixth switch cooperatively are connected to the constant high-level signal. A second terminal of the third switch, a second terminal of the fourth switch, a second terminal of the fifth switch, and a second terminal of the sixth switch cooperatively are connected to the output terminal of the scanning-level-signal-generation module. The control terminal of the fourth switch is connected to an output terminal of the NOR gate controller. The control terminal of the fifth switch is connected to the (N+1)th stage scanning signal; the control terminal of the sixth switch is connected to the reset signal.

Furthermore, the first switch, the second switch, and the third switch are P-type thin-film transistors, while the fourth switch, the fifth switch, and the sixth switch are N-type thin-film transistors. The control terminals of the first switch, the second switch, the third switch, the fourth switch, the fifth switch, and the sixth switch are gates, the first terminals of the first switch, the second switch, the third switch, the fourth switch, the fifth switch, and the sixth switch are sources, and the second terminals of the first switch, the second switch, the third switch, the fourth switch, the fifth switch, and the sixth switch are drains.

Furthermore, the reset signal from the scanning-level-signal-generation module is a high level signal.

Furthermore, the scanning-signal-output-module comprises a negative-AND (NAND) gate, a first inverter, a second inverter, and a third inverter. The NAND gate controller comprises a first input terminal, a second input terminal, and an output terminal; the first input terminal of the NAND gate controller is connected to the output terminal of the scanning-level-signal-generation module. The second input terminal of the NAND gate controller is connected to a clock signal. The first inverter, the second inverter, and the third inverter are connected in series. An input terminal of the first inverter is connected to the output terminal of the NAND gate controller; an output terminal of the third inverter outputs a scanning signal.

Furthermore, each of the plurality of scanning driver units is configured to drive a scanning line.

According to the present disclosure, a scanning driving circuit includes a plurality of cascade-connected scanning driver units. An Nth scanning driver unit of the plurality of scanning driver units includes a scanning-level-signal-generation module, configured to input an (N−1)th stage scanning signal, an (N+1)th stage scanning signal, and a reset signal, generate a scanning level signal based on the (N−1)th stage scanning signal, the (N+1)th stage scanning signal, and the reset signal, and hold the scanning level signal; the reset signal further resetting the scanning driving circuit, and a scanning-signal-output-module, connected to the scanning-level-signal-generation module, configured to input a clock signal, and configured to output a scanning signal based in the scanning level signal and the clock signal.

Furthermore, the scanning-level-signal-generation module comprises a first switch, a second switch, a third switch, a fourth switch, a fifth switch, a sixth switch, and an NOR gate controller. A control terminal of the first switch and a control terminal of the sixth switch cooperatively are connected to the (N−1)th stage scanning signal. A control terminal of the second switch and a control terminal of the fourth switch cooperatively are connected to a reset signal. The first terminal of the first switch and the first terminal of the second switch cooperatively receive the constant high-level signal. A first terminal of the fifth switch and a first terminal of the sixth switch cooperatively receive the constant low-level signal. A first terminal of the third switch is connected to a second terminal of the first switch. A first terminal of the fourth switch is connected to a second terminal of the fifth switch and a second terminal of the sixth switch. A control terminal of the third switch and a control terminal of the fifth switch cooperatively are connected to an output terminal of the scanning-level-signal-generation module. The NOR gate controller comprises a first input terminal, a second input terminal, and an output terminal; the first input terminal of the NOR gate controller is connected to a second terminal of the second switch, a second terminal of the third switch, a second terminal of the fourth switch; the second input terminal of the NOR gate controller is connected to the (N+1)th stage scanning signal. The output terminal of the NOR gate controller is connected to the output terminal of the scanning-level-signal-generation module.

Furthermore, the first switch, the second switch, and the third switch are P-type thin-film transistors, while the fourth switch, the fifth switch, and the sixth switch are N-type thin-film transistors. The control terminals of the first switch, the second switch, the third switch, the fourth switch, the fifth switch, and the sixth switch are gates, the first terminals of the first switch, the second switch, the third switch, the fourth switch, the fifth switch, and the sixth switch are sources, and the second terminals of the first switch, the second switch, the third switch, the fourth switch, the fifth switch, and the sixth switch are drains.

Furthermore, the reset signal from the scanning-level-signal-generation module is a low level signal.

Furthermore, the scanning-level-signal-generation module comprises: a first switch, a second switch, a third switch, a fourth switch, a fifth switch, a sixth switch, and an NOR gate controller. The NOR gate controller comprises a first input terminal, a second input terminal, and an output terminal. The first input terminal of the NOR gate controller is connected to the (N−1)th stage scanning signal. The second input terminal of the NOR gate controller is connected to an output terminal of the scanning-level-signal-generation module. The output terminal of the NOR gate controller is connected to the control terminal of the third switch. The control terminal of the first switch is connected to a reset signal. A first terminal of the first switch is connected to a constant high-level signal. A second terminal of the first switch is connected to a first terminal of the second switch. The control terminal of the second switch is connected to the (N+1)th stage scanning signal. A second terminal of the second switch is connected to a first terminal of the third switch. A first terminal of the fourth switch, a first terminal of the fifth switch, and a first terminal of the sixth switch cooperatively are connected to the constant high-level signal. A second terminal of the third switch, a second terminal of the fourth switch, a second terminal of the fifth switch, and a second terminal of the sixth switch cooperatively are connected to the output terminal of the scanning-level-signal-generation module. The control terminal of the fourth switch is connected to an output terminal of the NOR gate controller. The control terminal of the fifth switch is connected to the (N+1)th stage scanning signal; the control terminal of the sixth switch is connected to the reset signal.

Furthermore, the first switch, the second switch, and the third switch are P-type thin-film transistors, while the fourth switch, the fifth switch, and the sixth switch are N-type thin-film transistors. The control terminals of the first switch, the second switch, the third switch, the fourth switch, the fifth switch, and the sixth switch are gates, the first terminals of the first switch, the second switch, the third switch, the fourth switch, the fifth switch, and the sixth switch are sources, and the second terminals of the first switch, the second switch, the third switch, the fourth switch, the fifth switch, and the sixth switch are drains.

Furthermore, the reset signal from the scanning-level-signal-generation module is a high level signal.

Furthermore, the scanning-signal-output-module comprises a negative-AND (NAND) gate, a first inverter, a second inverter, and a third inverter. The NAND gate controller comprises a first input terminal, a second input terminal, and an output terminal; the first input terminal of the NAND gate controller is connected to the output terminal of the scanning-level-signal-generation module. The second input terminal of the NAND gate controller is connected to a clock signal. The first inverter, the second inverter, and the third inverter are connected in series. An input terminal of the first inverter is connected to the output terminal of the NAND gate controller; an output terminal of the third inverter outputs a scanning signal.

Furthermore, each of the plurality of scanning driver units is configured to drive a scanning line.

In still another aspect of the present disclosure, a liquid crystal display having a scanning driving circuit as provided above.

The benefits of the present disclosure are as follows: Compared with the scanning driving circuit in the related art where a clock control inverter forms a latch circuit, the scanning driving circuit proposed by the present disclosure adopts signal input which is not controlled by a clock signal CK and uses a latch module. The present disclosure effectively reduces load of the clock signal CK and power consumption of the circuit. The adoption of the present disclosure solves the problem that the design of the related art where the GOA circuit using a clock control inverter cooperating with an inverter for the design of a latch unit and adopts a clock signal to input the latch signal and control pull-down operation is disadvantageous of applying the clock signal CK to a high-resolution panel.

BRIEF DESCRIPTION OF THE SEVERAL VIEWS OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

In the related art, a scanning driving circuit uses a clock control inverter cooperating with an inverter for the design of a latch unit and adopts a clock signal to input the latch signal and control pull-down. Such a design brings a lot of load to a clock signal. Due to the load of the clock signal, the clock signal is hardly applied to a high-resolution panel. In light of this, the present disclosure proposes a solution to the defects of the related art.

The present disclosure proposes a scanning driving circuit. The scanning driving circuit includes a plurality of cascade-connected scanning driver units. An Nth scanning driver unit of the plurality of scanning driver units includes a scanning-level-signal-generation module, configured to input an (N−1)th stage scanning signal, an (N+1)th stage scanning signal, and a reset signal, generate a scanning level signal based on the (N−1)th stage scanning signal, the (N+1)th stage scanning signal, and the reset signal, and hold the scanning level signal; the reset signal further resetting the scanning driving circuit, and a scanning-signal-output-module, connected to the scanning-level-signal-generation module, configured to input a clock signal, and configured to output a scanning signal based in the scanning level signal and the clock signal. A constant low-level source is configured to supply a constant low-level signal. A constant high-level source is configured to supply a constant high-level signal.

Embodiment 1

Figure 1:
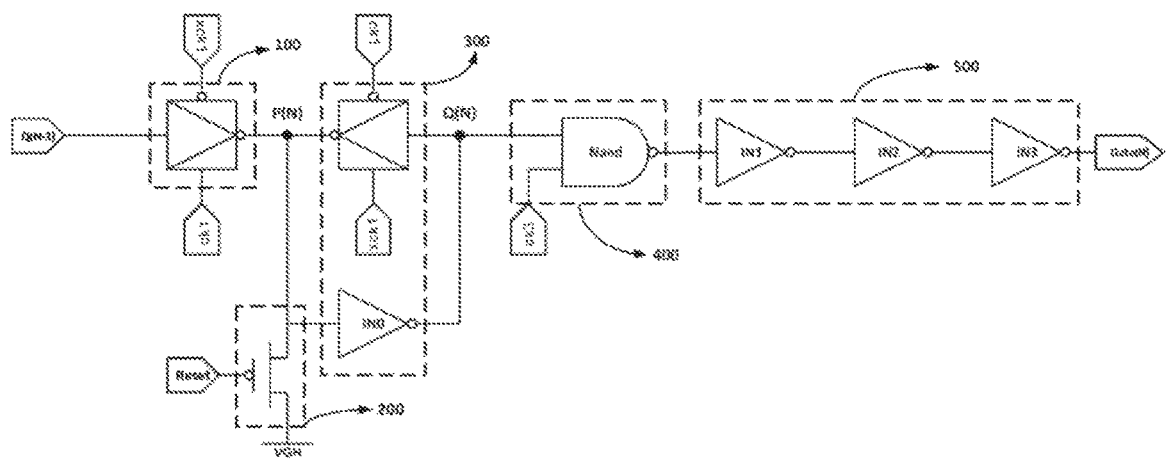
FIG. 1 illustrates a circuit diagram of a conventional scanning driving circuit.
Figure 2:
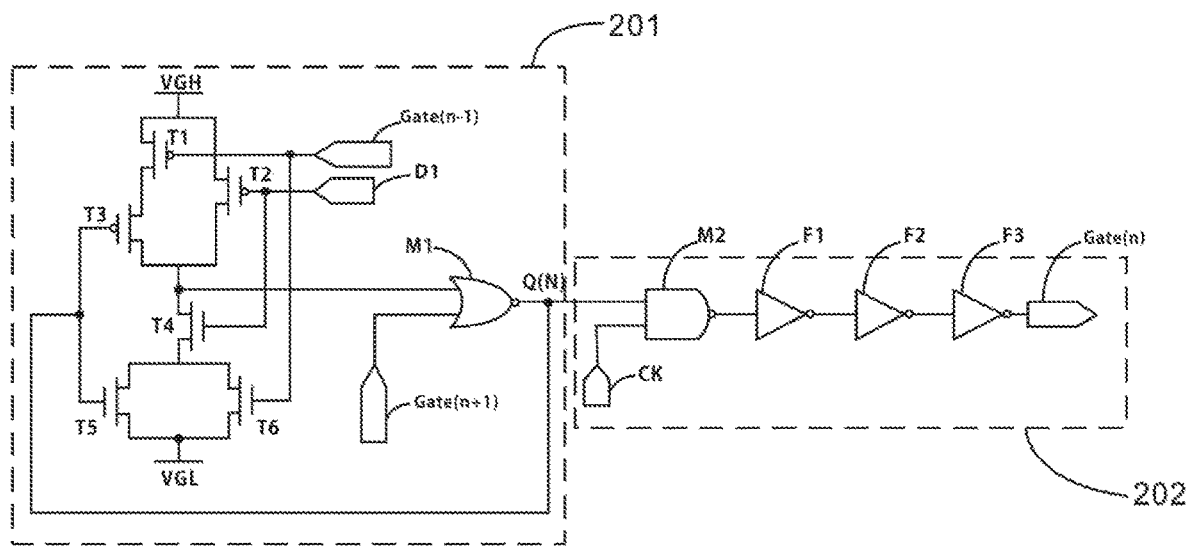
FIG. 2 illustrates a circuit diagram of a scanning driving circuit according to a first embodiment of the present disclosure.

Please refer to FIG. 2 illustrating a scanning driving circuit according to a first embodiment of the present disclosure.

The scanning driving circuit includes a scanning-level-signal-generation module 201 and a scanning-signal-output-module 202.

The scanning-level-signal-generation module 201 includes a first switch T1, a second switch T2, a third switch T3, a fourth switch T4, a fifth switch T5, a sixth switch T6, and an NOR gate controller M1. A control terminal of the first switch T1 and a control terminal of the sixth switch T6 cooperatively are connected to an (N−1)th stage scanning signal. A control terminal of the second switch T2 and a control terminal of the fourth switch T4 cooperatively are connected to a reset signal D1. The first terminal of the first switch T1 and the first terminal of the second switch T2 cooperatively receive a constant high-level signal VGH. A first terminal of the fifth switch T5 and a first terminal of the sixth switch T6 cooperatively receive a constant low-level signal VGL. A first terminal of the third switch T3 is connected to a second terminal of the first switch T1. A first terminal of the fourth switch T4 is connected to a second terminal of the fifth switch T5 and a second terminal of the sixth switch T6. A control terminal of the third switch T3 and a control terminal of the fifth switch T5 cooperatively are connected to an output terminal of the scanning-level-signal-generation module 201. The NOR gate controller M1 includes a first input terminal, a second input terminal, and an output terminal. The first input terminal of the NOR gate controller M1 is connected to a second terminal of the second switch T2, a second terminal of the third switch T3, a second terminal of the fourth switch T4. The second input terminal of the NOR gate controller M1 is connected to the (N+1)th stage scanning signal. The output terminal of the NOR gate controller M1 is connected to the output terminal of the scanning-level-signal-generation module 201.

The scanning-signal-output-module 202 includes a NAND gate controller M2, a first inverter F1, a second inverter F2, and a third inverter F3. The NAND gate controller M2 includes a first input terminal, a second input terminal, and an output terminal. The first input terminal of the NAND gate controller M2 is connected to the output terminal of the scanning-level-signal-generation module 201. The second input terminal of the NAND gate controller M2 is connected to a clock signal CK. The first inverter F1, the second inverter F2, and the third inverter F3 are connected in series. An input terminal of the first inverter F1 is connected to the output terminal of the NAND gate controller M2. An output terminal of the third inverter F3 outputs a scanning signal Gate(n).

The first switch T1, the second switch T2, and the third switch T3 are P-type thin-film transistors (TFTs). The fourth switch T4, the fifth switch T5, and the sixth switch T6 are N-type TFTs in the first embodiment. A first terminal of each of the switches corresponds to a gate of the TFT. A second terminal of each of the switches corresponds to a source of the TFT. A third terminal of each of the switches corresponds to a drain of the TFT.

The low-level reset signal D1 is input to the control terminal of the second switch T2 to turn on the second switch T2 when the scanning driving circuit is operating. The constant high-level signal VGH is input to the first terminal of the second switch T2, output through the second terminal of the second switch T2, and input to the first input terminal of the NOR gate controller M1. The (N+1)th stage scanning signal Gate(n+1) has not been turned yet so the constant low-level signal VGL is input to the second input terminal of the NOR gate controller M1. Therefore, a low-level pulse signal is output by the NOR gate controller M1, and the Q(N) node on the circuit is reset to be the low-level Q(N) node.

The low-level signal on the Q(N) node is input to the control terminal of the third switch T3 and the control terminal of the fifth switch T5. The third switch T3 is the P-type TFT, and the fifth switch T5 is the N-type TFT so the third switch T3 is turned on and the fifth switch T5 is turned off. The high-level pulse signal is output through the second terminal of the third switch T3 and input to the first input terminal of the NOR gate controller M1. The Q(N) node holds the low-level signal.

The low-level pulse signal on the Q(N) node is input to the first input terminal of the NAND gate controller M2. A low-level clock signal CK is input to the second input terminal of the NAND gate controller M2. Therefore, after passing through the first inverter F1, the second inverter F2, and the third inverter F3, the low-level pulse signal output by the NAND gate controller M2 is turned into the low-level scanning signal Gate(n) for output.

When the high-level pulse signal of the (N−1)th stage scanning signal Gate(n−1) arrives, the first switch T1 is turned off, the sixth switch T6 is turned on, and the fourth switch T4 is turned on with the high-level reset signal D1. The low-level pulse signal is input to the first terminal of the fourth switch T4, output to the second terminal of the fourth switch T4, input to the first terminal of the sixth switch T6, and finally output to the first input terminal of the NOR gate controller M1 through the second terminal of the sixth switch T6. Meanwhile, the (N+1)th stage scanning signal Gate(n+1) has not been turned on yet so the low-level pulse signal is input to the second input terminal of the NOR gate controller M1. Therefore, the high-level pulse signal is output by the NOR gate controller M1, and the Q(N) node on the circuit is reset to be the high-level Q(N) node.

The high-level signal on the Q(N) node is input to the control terminal of the third switch T3 and the control terminal of the fifth switch T5. The third switch T3 is the P-type TFT, and the fifth switch T5 is the N-type TFT so the third switch T3 is turned off and the fifth switch T5 is turned on. The low-level pulse signal is output through the fifth switch T5 and the fourth switch T4 to the first input terminal of the NOR gate controller M1. The Q(N) node holds the high-level signal.

The high-level pulse signal on the Q(N) node is input to the first input terminal of the NAND gate controller M2. A high-level clock signal CK is input to the second input terminal of the NAND gate controller M2. Therefore, after passing through the first inverter F1, the second inverter F2, and the third inverter F3, the low-level pulse signal output by the NAND gate controller M2 is turned into the high-level scanning signal Gate(n) for output.

Figure 3:
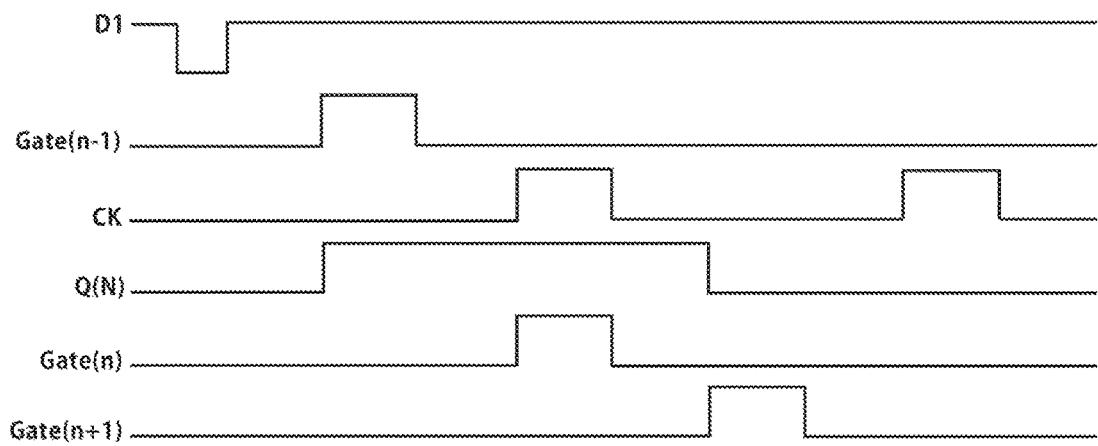
FIG. 3 is a timing diagram of a scanning driving circuit of the first embodiment of the present disclosure.

FIG. 3 is a timing diagram of a scanning driving circuit of the first embodiment of the present disclosure.

The sequence of the scanning driving circuit in the first embodiment is as follows: A low-level reset signal D1 is input to a circuit to reset the circuit before a cascaded signal is input. A Q(N) node on the circuit is reset to be on a low level. A scanning signal Gate(n) is on a low level. When a high-level pulse signal of the (N−1)th stage scanning signal Gate(n−1) arrives, the Q(N) node is charged to be on a high level. Subsequently, a latch circuit holds the high-level pulse signal on the Q(N) node. When a high-level clock signal CK is input by an NAND gate controller M2, the high level of the scanning signal Gate(n) is outputted to generate a gate driver signal. When a high-level pulse signal of the (N+1)th stage scanning signal Gate(n+1) arrives, the Q(N) node is charged to be on a low level. Subsequently, the Q(N) node constantly holds the low-level signal, and the scanning signal Gate(n) keeps on the low level for output.

Embodiment 2

Figure 4:
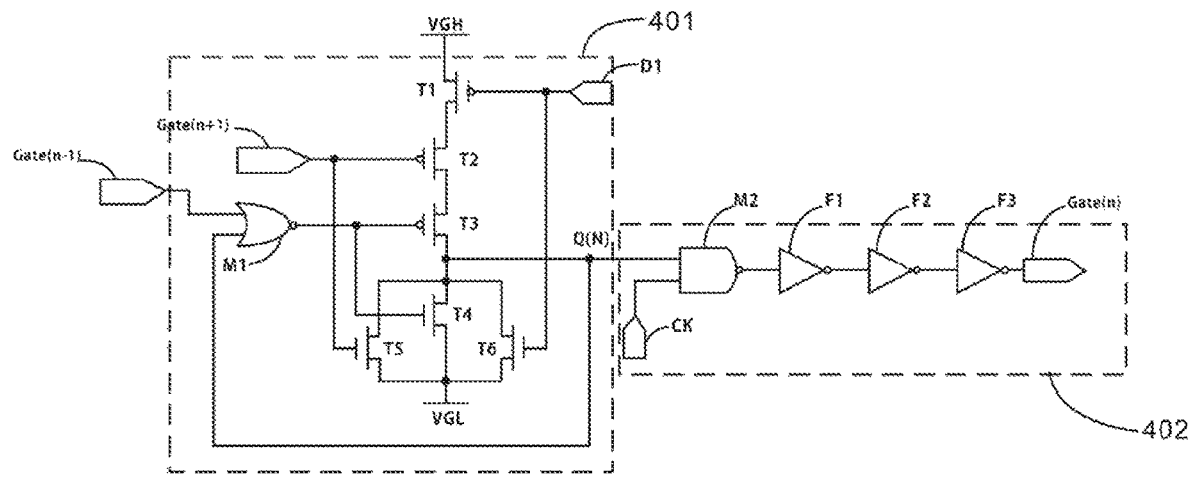
FIG. 4 illustrates a circuit diagram of a scanning driving circuit according to a second embodiment of the present disclosure.

As FIG. 4 shows, a scanning driving circuit includes a scanning-level-signal-generation module 401 and a scanning-signal output module 402.

The scanning-level-signal-generation module 401 includes a first switch T1, a second switch T2, a third switch T3, a fourth switch T4, a fifth switch T5, a sixth switch T6, and an NOR gate controller M1. The NOR gate controller M1 includes a first input terminal, a second input terminal, and an output terminal. The first input terminal of the NOR gate controller M1 is connected to an (N−1)th stage scanning signal Gate(n−1). The second input terminal of the NOR gate controller M1 is connected to an output terminal of the scanning-level-signal-generation module 401. The output terminal of the NOR gate controller M1 is connected to a control terminal of the third switch T3. A control terminal of the first switch T1 is connected to a reset signal D1. A first terminal of the first switch T1 is connected to a constant high-level signal VGH. A second terminal of the first switch T1 is connected to a first terminal of the second switch T2. A control terminal of the second switch T2 is connected to an (N+1)th stage scanning signal Gate(n+1). A second terminal of the second switch T2 is connected to a first terminal of the third switch T3. A first terminal of the fourth switch T4, a first terminal of the fifth switch T5 and a first terminal of the sixth switch T6 cooperatively receive the constant high-level signal VGH. A first terminal of the third switch T3 is connected to a second terminal of the first switch T1. A first terminal of the fourth switch T4, a first terminal of the fifth switch T5, and a first terminal of the sixth switch T6 cooperatively are connected to the constant high-level signal VGH. A second terminal of the third switch T3, a second terminal of the fourth switch T4, a second terminal of the fifth switch T5, and a second terminal of the sixth switch T6 cooperatively are connected to the output terminal of the scanning-level-signal-generation module 401. A control terminal of the fourth switch T4 is connected to an output terminal of the NOR gate controller M1. A control terminal of the fifth switch T5 is connected to the (N+1)th stage scanning signal Gate(n+1). A control terminal of the sixth switch T6 is connected to the reset signal D1.

The scanning signal output module 402 includes a NAND gate M2, a first inverter F1, a second inverter F2, and a third inverter F3. The NAND gate controller M2 includes a first input terminal, a second input terminal, and an output terminal. The first input terminal of the NAND gate controller M2 is connected to the output terminal of the scanning-level-signal-generation module 401. The second input terminal of the NAND gate controller M2 is connected to a clock signal CK. The first inverter F1, the second inverter F2, and the third inverter F3 are connected in series. An input terminal of the first inverter F1 is connected to the output terminal of the NAND gate controller M2. An output terminal of the third inverter F3 outputs a scanning signal Gate(n).

The first switch T1, the second switch T2, and the third switch T3 are N-type thin-film transistors (TFTs). The fourth switch T4, the fifth switch T5, and the sixth switch T6 are P-type TFTs in the second embodiment. A first terminal of each of the switches corresponds to a gate of the TFT. A second terminal of each of the switches corresponds to a source of the TFT. A third terminal of each of the switches corresponds to a drain of the TFT.

The high-level reset signal D1 is input to the control terminal of the sixth switch T6 to turn on the sixth switch T6 when the scanning driving circuit is operating. A low-level pulse signal is input to the first terminal of the sixth switch T6 and output from the second terminal of the sixth switch T6 to the Q(N) node. The Q(N) node is reset to be the low-level Q(N) node.

The low-level signal on the Q(N) node is input to the second input terminal of the NOR gate controller M1. Meanwhile, an (N−1)th stage low-level scanning signal Gate(n−1) is input to the first input terminal of the NOR gate controller M1. Therefore, the NOR gate controller M1 outputs a high-level pulse signal, and the fourth switch T4 is turned on. Also, a constant low-level signal VGL is output to the Q(N) node through the fourth switch T4. The Q(N) node holds the low-level signal.

The low-level pulse signal on the Q(N) node is input to the first input terminal of the NAND gate controller M2. A high-level clock signal CK is input to the second input terminal of the NAND gate controller M2. Therefore, after passing through the first inverter F1, the second inverter F2, and the third inverter F3, the high-level pulse signal output by the NAND gate controller M2 is turned into the low-level scanning signal for output.

The low-level reset signal D1 is input to the control terminal of the first switch T1 to turn on the first switch T1. Meanwhile, the (N+1)th stage scanning signal Gate(n+1) has not been turned on yet so the low-level pulse signal is input to the control terminal of the second switch T2, the second switch T2 is turned on, and the high-level pulse signal is output to the first input terminal of the NOR gate controller M1. Therefore, the low-level pulse signal is output by the output terminal of the NOR gate controller M1, and the third switch T3 is turned on. Also, the constant high-level signal VGH is input to the first switch T1, output to the Q(N) node through the second switch T2 and the third switch T3. At this time, the Q(N) node is on a high level.

The high-level signal on the Q(N) node is input to the second input terminal of the NOR gate controller M1. Meanwhile, the (N−1)th stage low-level scanning signal Gate(n−1) is input to the first input terminal of the NOR gate controller M1. Therefore, the NOR gate controller M1 outputs a low-level pulse signal, and the third switch T3 keeps turned on. Also, the constant high-level signal VGH is output to the Q(N) node through the first switch T1, the second switch T2, and the third switch T3. The Q(N) node holds the high-level signal.

The high-level pulse signal on the Q(N) node is input to the first input terminal of the NAND gate controller M2. A high-level clock signal CK is input to the second input terminal of the NAND gate controller M2. Therefore, after passing through the first inverter F1, the second inverter F2, and the third inverter F3, the low-level pulse signal output by the NAND gate controller M2 is turned into the high-level scanning signal Gate(n) for output.

Figure 5:
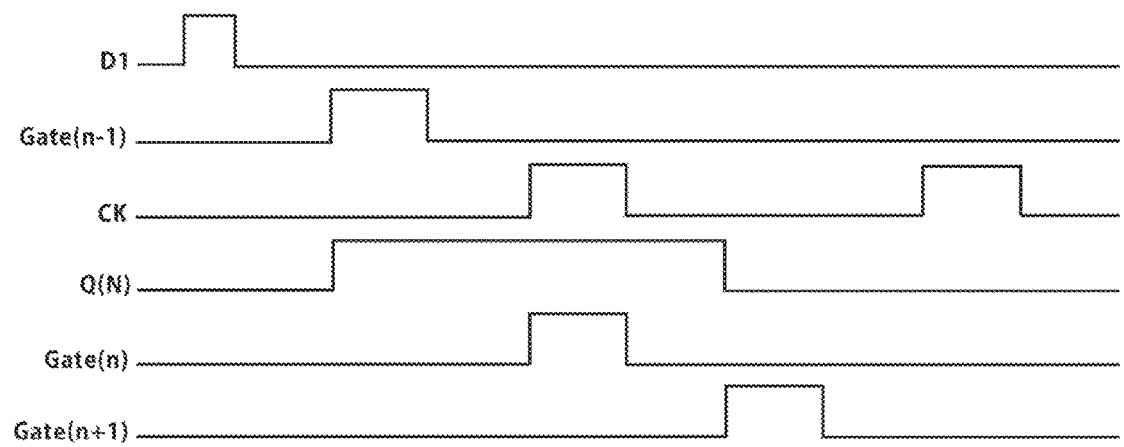
FIG. 5 is a timing diagram of a scanning driving circuit of the second embodiment of the present disclosure.

FIG. 5 is a timing diagram of a scanning driving circuit of the second embodiment of the present disclosure.

The sequence of the scanning driving circuit in the second embodiment is as follows: A high-level reset signal D1 is input to a circuit to reset the circuit before a stage-transmittance signal is input. A Q(N) node on the circuit is reset to be on a low level. A scanning signal Gate(n) is on a low level. When a high-level pulse signal of the (N−1)th stage scanning signal Gate(n−1) arrives, the Q(N) node is charged to be on a high level. Subsequently, a latch circuit holds the high-level pulse signal on the Q(N) node. When a high-level clock signal CK is input by a negative-AND (NAND) gate controller M2, the scanning signal outputs a high-level signal to generate a gate driver signal. When a high-level pulse signal of the (N+1)th stage scanning signal Gate(n+1) arrives, the Q(N) node is charged to be on a low level. Subsequently, the Q(N) node constantly holds the low-level signal, and the Gate(n) signal keeps on the low level for output.

A liquid crystal display panel including a scanning driving circuit as described above is also proposed.

The operating principle of the liquid crystal display panel in the third embodiment is the same as the operating principle of the scanning driving circuit introduced in the first and second embodiments. Therefore, the operating principle of the liquid crystal display panel will not be detailed.

Compared with the scanning driving circuit in the related art where a clock control inverter forms a latch circuit, the scanning driving circuit proposed by the present disclosure adopts signal input which is not controlled by a clock signal CK and uses a latch module. The present disclosure effectively reduces load of the clock signal CK and power consumption of the circuit. The adoption of the present disclosure solves the problem that the design of the related art where the GOA circuit using a clock control inverter cooperating with an inverter for the design of a latch unit and adopts a clock signal to input the latch signal and control pull-down operation is disadvantageous of applying the clock signal CK to a high-resolution panel.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A scanning driving circuit, comprising: a plurality of cascade-connected scanning driver units; an Nth scanning driver unit of the plurality of scanning driver units comprising:
    a scanning-level-signal-generation module, configured to input an (N−1)th stage scanning signal, an (N+1)th stage scanning signal, and a reset signal, generate a scanning level signal based on the (N−1)th stage scanning signal, the (N+1)th stage scanning signal, and the reset signal, and hold the scanning level signal; the reset signal further resetting the scanning driving circuit;
    a scanning-signal-output-module, connected to the scanning-level-signal-generation module, configured to input a clock signal, and configured to output a scanning signal based in the scanning level signal and the clock signal;
    a constant low-level source, configured to supply a constant low-level signal; and
    a constant high-level source, configured to supply a constant high-level signal,
    wherein the scanning-level-signal-generation module comprises a first switch, a second switch, a third switch, a fourth switch, a fifth switch, a sixth switch, and an NOR gate controller;
    a control terminal of the first switch and a control terminal of the sixth switch cooperatively are connected to the (N−1)th stage scanning signal; a control terminal of the second switch and a control terminal of the fourth switch cooperatively are connected to the reset signal; a first terminal of the first switch and a first terminal of the second switch cooperatively receive the constant high-level signal; a first terminal of the fifth switch and a first terminal of the sixth switch cooperatively receive the constant low-level signal;
    a first terminal of the third switch is connected to a second terminal of the first switch; a first terminal of the fourth switch is connected to a second terminal of the fifth switch and a second terminal of the sixth switch; a control terminal of the third switch and a control terminal of the fifth switch cooperatively are connected to an output terminal of the scanning-level-signal-generation module;
    the NOR gate controller comprises a first input terminal, a second input terminal, and an output terminal; the first input terminal of the NOR gate controller is connected to a second terminal of the second switch, a second terminal of the third switch, a second terminal of the fourth switch; the second input terminal of the NOR gate controller is connected to the (N+1)th stage scanning signal;
    the output terminal of the NOR gate controller is connected to the output terminal of the scanning-level-signal-generation module.

2. The scanning driving circuit of claim 1, wherein the first switch, the second switch, and the third switch are P-type thin-film transistors, while the fourth switch, the fifth switch, and the sixth switch are N-type thin-film transistors, where the control terminals of the first switch, the second switch, the third switch, the fourth switch, the fifth switch, and the sixth switch are gates, the first terminals of the first switch, the second switch, the third switch, the fourth switch, the fifth switch, and the sixth switch are sources, and the second terminals of the first switch, the second switch, the third switch, the fourth switch, the fifth switch, and the sixth switch are drains.

3. The scanning driving circuit of claim 2, wherein the reset signal from the scanning-level-signal-generation module is a low level signal.

4. The scanning driving circuit of claim 1, wherein the scanning-signal-output-module comprises a negative-AND (NAND) gate, a first inverter, a second inverter, and a third inverter;
    the NAND gate controller comprises a first input terminal, a second input terminal, and an output terminal; the first input terminal of the NAND gate controller is connected to the output terminal of the scanning-level-signal-generation module; the second input terminal of the NAND gate controller is connected to a clock signal;
    the first inverter, the second inverter, and the third inverter are connected in series;
    an input terminal of the first inverter is connected to the output terminal of the NAND gate controller; an output terminal of the third inverter outputs a scanning signal.

5. The scanning driving circuit of claim 1, wherein each of the plurality of scanning driver units is configured to drive a scanning line.

6. A scanning driving circuit, comprising: a plurality of cascade-connected scanning driver units; an Nth scanning driver unit of the plurality of scanning driver units comprising:
    a scanning-level-signal-generation module, configured to input an (N−1)th stage scanning signal, an (N+1)th stage scanning signal, and a reset signal, generate a scanning level signal based on the (N−1)th stage scanning signal, the (N+1)th stage scanning signal, and the reset signal, and hold the scanning level signal; the reset signal further resetting the scanning driving circuit; and
    a scanning-signal-output-module, connected to the scanning-level-signal-generation module, configured to input a clock signal, and configured to output a scanning signal based in the scanning level signal and the clock signal,
    wherein the scanning-level-signal-generation module comprises: a first switch, a second switch, a third switch, a fourth switch, a fifth switch, a sixth switch, and an NOR gate controller;

the NOR gate controller comprises a first input terminal, a second input terminal, and an output terminal; the first input terminal of the NOR gate controller is connected to the (N−1)th stage scanning signal; the second input terminal of the NOR gate controller is connected to an output terminal of the scanning-level-signal-generation module; the output terminal of the NOR gate controller is connected to the control terminal of the third switch;

the control terminal of the first switch is connected to a reset signal; a first terminal of the first switch is connected to a constant high-level signal; a second terminal of the first switch is connected to a first terminal of the second switch;

the control terminal of the second switch is connected to the (N+1)th stage scanning signal; a second terminal of the second switch is connected to a first terminal of the third switch;

a first terminal of the fourth switch, a first terminal of the fifth switch, and a first terminal of the sixth switch cooperatively are connected to the constant high-level signal; a second terminal of the third switch, a second terminal of the fourth switch, a second terminal of the fifth switch, and a second terminal of the sixth switch cooperatively are connected to the output terminal of the scanning-level-signal-generation module;

the control terminal of the fourth switch is connected to an output terminal of the NOR gate controller; the control terminal of the fifth switch is connected to the (N+1)th stage scanning signal; the control terminal of the sixth switch is connected to the reset signal.

7. The scanning driving circuit of claim 6, wherein the first switch, the second switch, and the third switch are P-type thin-film transistors, while the fourth switch, the fifth switch, and the sixth switch are N-type thin-film transistors, where the control terminals of the first switch, the second switch, the third switch, the fourth switch, the fifth switch, and the sixth switch are gates, the first terminals of the first switch, the second switch, the third switch, the fourth switch, the fifth switch, and the sixth switch are sources, and the second terminals of the first switch, the second switch, the third switch, the fourth switch, the fifth switch, and the sixth switch are drains.

8. The scanning driving circuit of claim 7, wherein the reset signal from the scanning-level-signal-generation module is a high level signal.

9. The scanning driving circuit of claim 6, wherein the scanning-signal-output-module comprises a negative-AND (NAND) gate, a first inverter, a second inverter, and a third inverter;

the NAND gate controller comprises a first input terminal, a second input terminal, and an output terminal; the first input terminal of the NAND gate controller is connected to the output terminal of the scanning-level-signal-generation module; the second input terminal of the NAND gate controller is connected to a clock signal;

the first inverter, the second inverter, and the third inverter are connected in series;

an input terminal of the first inverter is connected to the output terminal of the NAND gate controller; an output terminal of the third inverter outputs a scanning signal.

10. The scanning driving circuit of claim 6, wherein each of the plurality of scanning driver units is configured to drive a scanning line.

* * * * *

UNITED STATES PATENT AND TRADEMARK OFFICE
CERTIFICATE OF CORRECTION

PATENT NO. : 10,600,380 B2  
APPLICATION NO. : 15/548414  
DATED : March 24, 2020  
INVENTOR(S) : Mang Zhao et al.

Page 1 of 1

It is certified that error appears in the above-identified patent and that said Letters Patent is hereby corrected as shown below:

On the Title Page

Item (73) Assignee, Line 1, "Optoeelectronics" should be changed to -- Optoelectronics --

Signed and Sealed this  
Seventh Day of July, 2020

Andrei Iancu  
*Director of the United States Patent and Trademark Office*